United States Patent [19]

Leung

[11] Patent Number: 5,940,851
[45] Date of Patent: Aug. 17, 1999

[54] METHOD AND APPARATUS FOR DRAM REFRESH USING MASTER, SLAVE AND SELF-REFRESH MODES

[75] Inventor: Wingyu Leung, Cupertino, Calif.

[73] Assignee: Monolithic Systems, Inc., Sunnyvale, Calif.

[21] Appl. No.: 08/757,494

[22] Filed: Nov. 27, 1996

[51] Int. Cl.[6] ...................................................... G06F 12/16
[52] U.S. Cl. ...................... 711/106; 365/230.06; 365/222
[58] Field of Search ................................ 365/222, 230.06

[56] References Cited

U.S. PATENT DOCUMENTS

| | | | |
|---|---|---|---|
| 4,575,826 | 3/1986 | Dean | 365/222 |
| 5,349,562 | 9/1994 | Tanizaki | 365/222 |
| 5,430,680 | 7/1995 | Parris | 365/222 |
| 5,559,750 | 9/1996 | Dosaka et al. | 365/230.06 |

*Primary Examiner*—Tod R. Swann
*Assistant Examiner*—David Langjahr
*Attorney, Agent, or Firm*—Skjerven, Morrill, MacPherson, Franklin & Friel LLP; Norman R. Klivans

[57] ABSTRACT

Method and apparatus for refreshing DRAM devices (chips) in a computer system. Each DRAM device incorporates circuitry to carry out a burst of RAS cycles during each refresh period. Three different modes are used to trigger the device into refresh. In one mode, each DRAM device incorporates a refresh timer; only one master DRAM device in the system has its refresh timer enabled. The refresh master device generates a refresh request every time the refresh timer times up. A memory controller, after receiving the request, generates an acknowledge signal when certain system conditions are met. All DRAM devices in the system monitor the refresh request and acknowledge handshake continuously. Upon detection of refresh acknowledge, each DRAM device caries out a sequence of predesignated refresh cycles. In a second mode, the DRAM devices are all strapped as refresh slaves and the refresh timer resides in the memory controller which drives the same refresh acknowledge signal low for two clock cycles when the refresh timer times-up. Upon receiving the acknowledge signal, the DRAM devices each carry out the refresh operation. In a third (self refresh) mode, each DRAM device generates a internal clock signal, which has a different frequency and phase relationship with the external clock signal, for operating its internal refresh timer and refresh logic. Each DRAM device carries out its refresh periodically without communicating to the controller or the other DRAM devices. Each of the three refresh modes is selected by externally supplied mode select signals.

32 Claims, 8 Drawing Sheets

METHOD AND APPARATUS FOR DRAM REFRESH USING MASTER, SLAVE AND SELF-REFRESH MODES

BACKGROUND OF THE INVENTION

1. Field of the Invention

The present application relates to DRAM and specifically to refresh of a DRAM.

2. Description of the Prior Art

DRAM (dynamic random access memory) has the lowest cost and highest density (cells per unit area) of any type of RAM. However, each DRAM cell (including a transistor and a capacitor) must be periodically refreshed to restore charge to its capacitor as the charge leaks away. During refresh, no other operation to that cell can take place. Usually refresh is done to each row in a DRAM array, one row at a time. During refresh, the DRAM row of cells is turned on and voltage applied to that row of cells to recharge each capacitor in that row. Refreshing adds complexity (cost) to any DRAM system and reduces performance. Refresh usually involves a row address strobe (RAS) for RAS only refresh, and RAS and CAS for the activation of CAS before RAS refresh. To address the DRAM array, the row addresses are applied to the DRAM chip address pins, then strobed in by the RAS signal. The column addresses are then applied to the same set of address pins and strobed in by the CAS signal.

Techniques such as RAS only refresh, CAS-before-RAS refresh, and hidden refresh are commonly used for refreshing DRAM devices in a memory system. These techniques are well documented in the data books of DRAM suppliers, for example, 1991 *Memory Products Data Book,* NEC Electronics Inc.. In all these techniques, only one row of DRAM cells (in one or more banks) is refreshed at one time, and the refreshed memory bank(s) go(es) through one complete RAS cycle. For RAS only refresh, the row and bank address is supplied externally. For the other types of refresh, the row and bank address are supplied internally by a refresh address counter. In these techniques, sequences of RAS and/or CAS signals are used to instruct the memory device to enter a refresh cycle.

These prior art approaches either reduce system performance or require excessive intervention from the memory controller to perform refresh.

SUMMARY

The present invention is directed to both a signal and protocol for instructing a memory device to begin the refresh operation, and the logic and circuitry incorporated in the device for handling the refresh.

In accordance with this invention, three different modes are used to trigger the DRAM into the refresh operation. In one mode, all the DRAM devices (chips) in a computer system incorporate a refresh timer, but only one DRAM device in the system (designated the refresh master) has its refresh timer enabled. The refresh master device generates a refresh request every time its refresh timer times up. The memory controller, after receiving the request, generates an acknowledge signal when certain system conditions, such as no memory access from the CPU or peripheral devices in the computer system, are met. All the DRAM devices in the system monitor the refresh request and acknowledge handshake continuously. Upon the detection of refresh acknowledge, each DRAM device caries out a sequence of predesignated RAS (memory) cycles for refreshing multiple rows of the array.

In the second mode, the DRAM devices are strapped as refresh slaves with their refresh timers disabled, and the refresh timer which resides in the memory controller is enabled. The memory controller drives the same refresh acknowledge signal line for two clock cycles when the refresh timer times up. Upon receiving the acknowledge signal, each DRAM device carries out the refresh cycle sequence.

In the third mode, each DRAM device generates an internal clock signal, each of which may have a different frequency and phase relationship with the external (system) clock signal, for operating its internal refresh timer and refresh logic. Each DRAM device carries out its refresh periodically, without communicating to the other DRAM devices or controller in the system.

The three modes of refresh operations are selected by externally supplied mode select signals. These signals can be controlled by the controller or connected to the power supply or ground. In the former case refresh modes can be changed during system run time. In the latter case the refresh mode cannot be changed without changing the connections of the mode signals. It is to be understood that except as described herein, a DRAM device in accordance with this invention is conventional in structure and operation.

Advantageously, DRAM devices in accordance with this invention can be substituted in a computer system for the more expensive SRAM (static RAM) devices which do not require refresh. This is achieved by use of the sleep mode and the master/slave modes. Moreover, the use of an acknowledge handshake in accordance with this invention to enter the sleep mode is an improvement over certain types of conventional synchronous DRAM which operates in a "self refresh mode" in response to a single command.

DETAILED DESCRIPTION

In accordance with the present invention, a DRAM device (chip) incorporates refresh circuitry so that when the refresh protocol is executed, the device executes a burst (sequence) of RAS cycles automatically, without further supervision from outside (i.e. from other memory devices or a memory controller). For each RAS cycle, one row of memory cells of the array of cells of the DRAM device is refreshed. The row addresses for the refresh operation are generated internally in each device. In one embodiment, five rows of DRAM cells are refreshed in each refresh period. That is the device goes through 5 RAS cycles for each refresh period. Each DRAM device incorporates a refresh timer and uses a m/s_b signal for selecting the master or slave mode of operation. In the master mode, the device generates a pulse on a dedicated signal line, designated krqak_b, each time the refresh timer times up. The device then waits for an acknowledge (in the form of a pulse on the same signal line krqak_b) sent from the memory controller before starting the burst refresh sequence.

Figure 1:
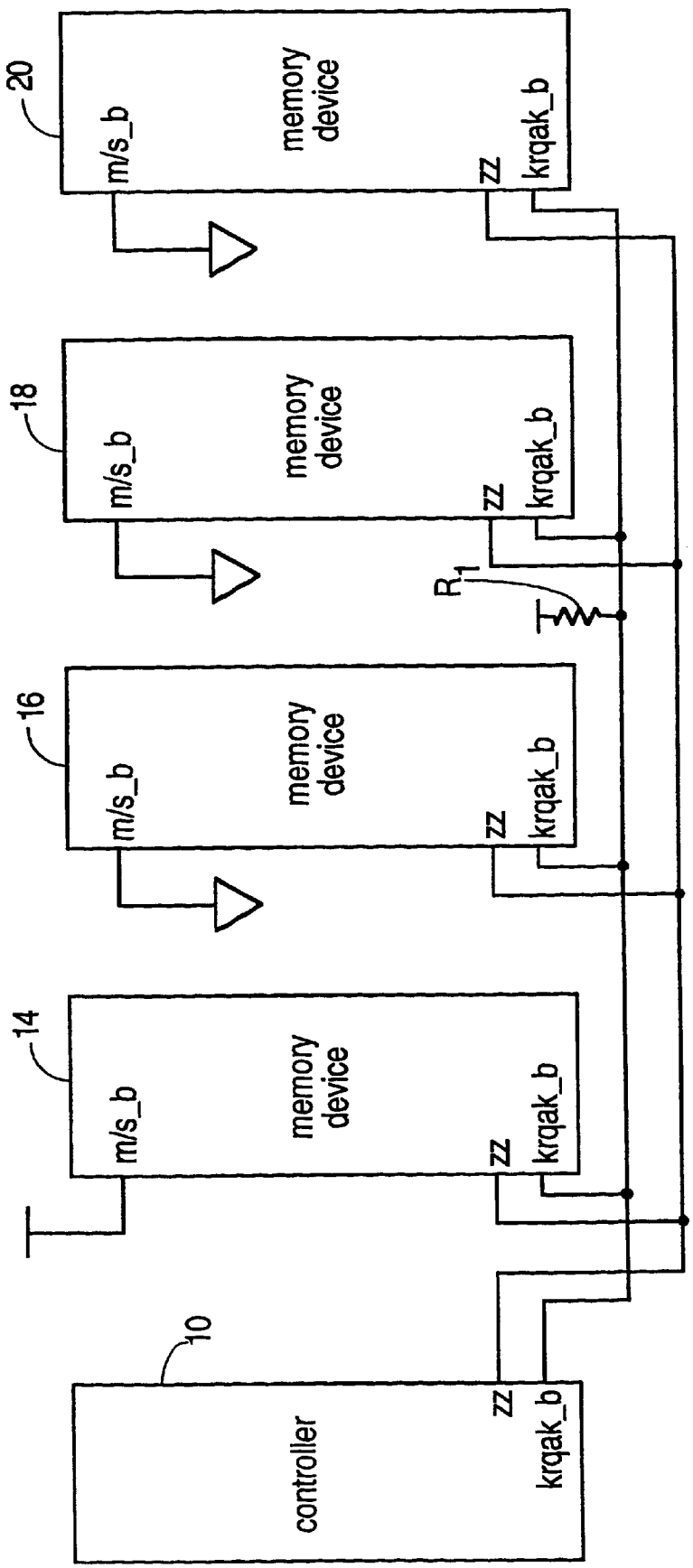
FIG. 1 shows several DRAM devices coupled to a memory controller.

In the slave mode, the device's refresh timer is disabled and the device only "listens" to the activities on the krqak_b signal line. The slave mode device enters burst refresh on every other activation pulse detected on the krqak_b signal line. In a system where multiple memory devices are present, only one device is selected to be the master, and the other devices are selected to operate as slaves. FIG. 1 shows a block diagram of such a system in accordance with this invention, where a memory controller 10 is connected in parallel to multiple memory devices (chips) 14, 16, 18, 20. Only the pertinent terminals of the memory devices are shown; the other conventional terminals (pins) for e.g. power, address, data, timing, etc. are not illustrated. Note that only the master memory device 14 has its m/s_b input terminal strapped (connected to) high (logic high); the other devices 16, 18, 20 have their m/s_b input terminals connected to ground potential. In this system occasionally the controller 10 may be kept busy for a long period of time, so the controller 10 may not be able to generate an acknowledge signal before the refresh timer times up again. If the master device 14 sends out another request pulse on the krqak_b line, the slave devices 16, 18, 20 may mistakenly trigger to perform refresh.

To avoid such a problem, a circuit is incorporated in each memory device 14, 16, 18, 20 to suppress the generation of the request pulse in the master device 14 when a request is still pending. To avoid under-refreshing the memory devices, the refresh requests are queued up in an internal counter in each device, as explained further below. A queued request can be sent after the pending acknowledge signal is received and the burst refresh is finished. During the refresh period, all memory devices go through the burst refresh simultaneously and no memory access is allowed. In one embodiment, the refresh period lasts for five RAS cycles. With a RAS cycle time of 3 clock cycles, the total refresh period is 15 clock cycles.

In another mode of operation, all the memory devices 14, 16, 18, 20 have their m/s_b terminals connected so as to operate in the slave mode. In this slave mode, the refresh timer in each memory device is disabled and the memory controller incorporates a refresh timer. The krqak_b signal line only carries an input signal to the memory devices. When it is time for refresh, the memory controller 10 simply drives the krqak_b signal low for two clock cycles. Note that these two low cycles can be consecutive or separated by a number of clock cycles in which the Krqak_b signal is high. (Note that "high" and "low" here merely refer to arbitrary logic states, e.g. activated and deactivated, and not to actual signal levels.)

The memory devices 14, 16, 18, 20 also each incorporate a self-refresh circuit which is activated when the memory device enters a self refresh (sleep) mode. A zz input signal line is incorporated in each device for invoking this operation; the device operates in the sleep mode when signal zz (on line zz) is high. In the sleep mode, the external clock signal (supplied by the controller or other clock source in the system) is turned off. An internal clock generator circuit in each device, e.g. a ring oscillator, is used to keep operative the circuitry in the device associated with the refresh operation only. Thus there is a logic clock signal used for clocking the internal circuit in each device. In normal operation, the source of this clock signal is an external source. In sleep mode, the source of the clock signal is the internally generated clock signal. Switching between these is performed so as to suppress clock glitches, as described in detail below, upon entering and leaving the sleep mode. In sleep mode, the refresh timer in each memory device is activated. When the refresh time period is up, the memory initiates the refresh operation automatically. No refresh request is sent to the memory controller 10, and the devices 14, 16, 18, 20 do not monitor the signals on the krqak_b line. Thus any acknowledge signals from the controller 10 are ignored. Accumulated requests in the master device 14 are cleared. Any pending request (a request sent to the memory controller 10) is canceled.

Figure 2:
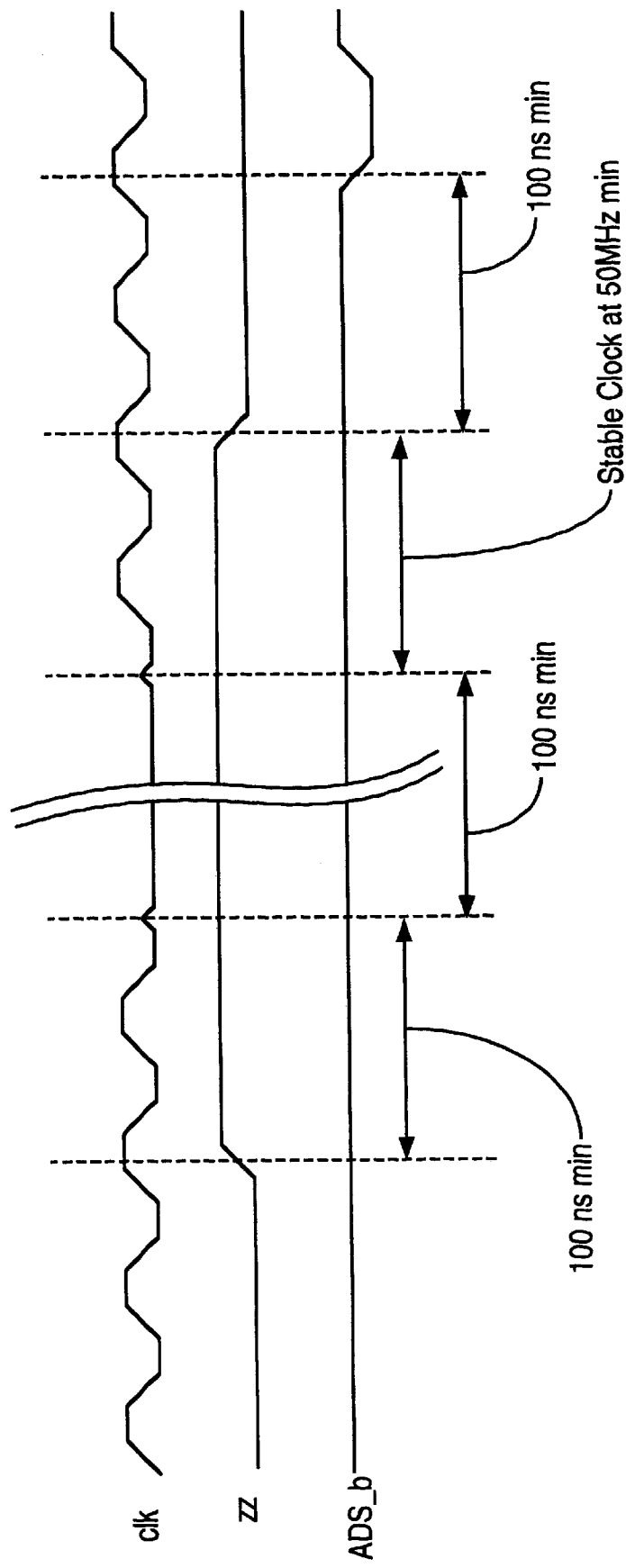
FIG. 2 shows a timing diagram of zz (sleep mode) control.

FIG. 2 shows the timing waveforms of the zz, clk and ADS_b signals for the present memory device for both slave and master modes. ADS_b is the conventional address strobe signal sent from the controller to signal that an address for a new memory transaction is valid on the address bus. When signal zz is high, the memory device is instructed to enter the sleep mode of operation. At this time no memory access, as indicated by the ADS_b signal level being high, is processed. After a minimum time of e.g. 100 ns, the external clock signal clk is turned off (stays low or high). The minimum time that the clock signal clk will stay low or high is e.g. 100 ns. Before signal zz is deactivated, the signal clk is reactivated for a minimum 100 ns. Memory access (signal ADS_b low) is recognized for 100 ns after signal zz goes low. This ensures proper timing for entry and exit by the device to the sleep mode.

Figure 3:
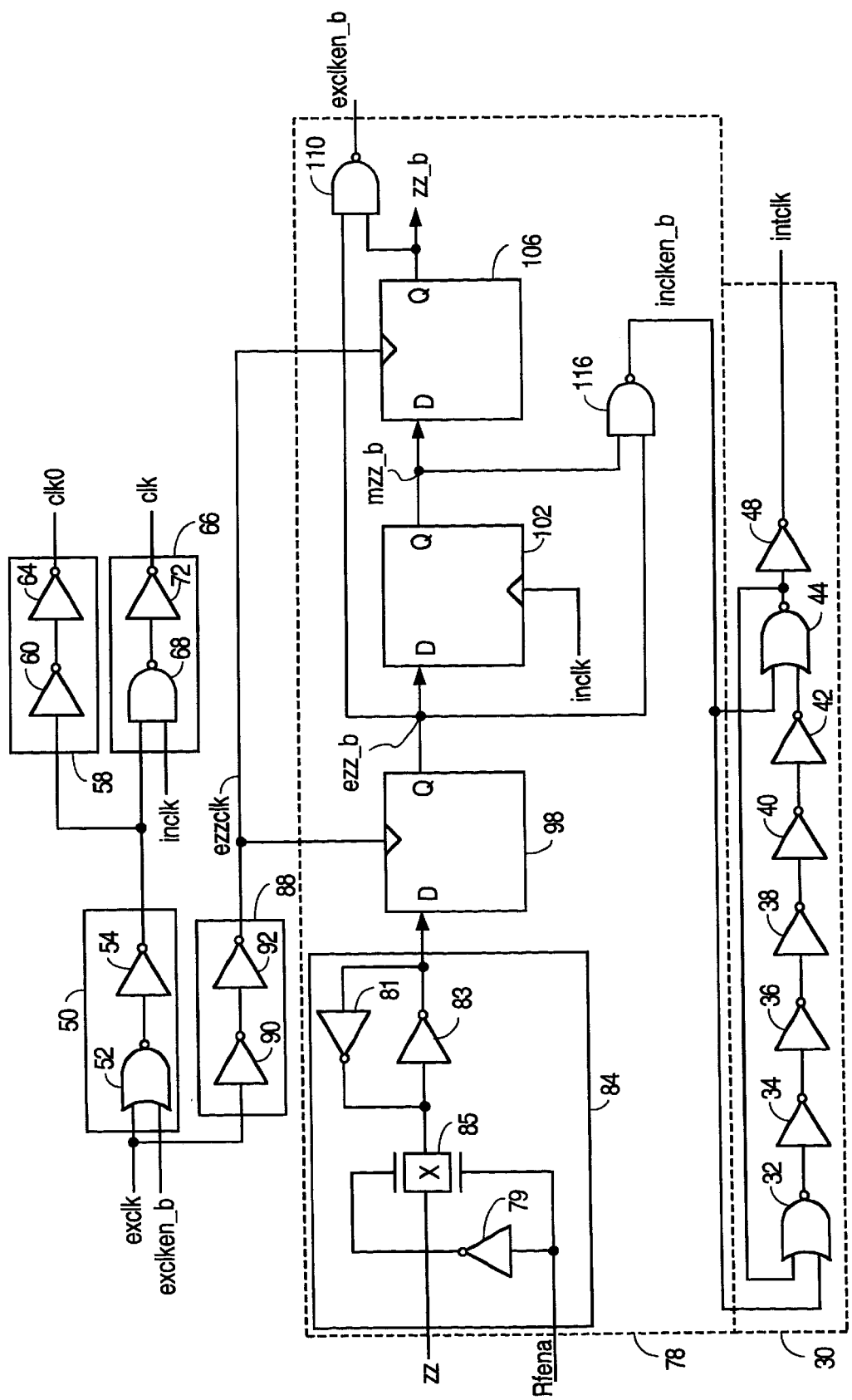
FIG. 3 shows a schematic of zz and clock control logic.

FIG. 3 shows a schematic diagram of the associated zz and clock signal control circuit which is in each memory device in accordance with this invention. The internal clock signal inck is generated by the ring oscillator 30, including NOR gate 32, inverters 34, 36, 38, 40, and 42, NOR gate 44, and inverter 48. In one embodiment, oscillator 30 oscillates at a frequency close to (but less than) that of the external clock signal exclk. Signal exclk is buffered by the buffer 50 consisting of NOR gate 52 and inverter 54. The output terminal of buffer 50 drives two buffers 58 and 66. The output terminals of buffers 58, 66 generate the clock signals clko and clk. Signal clko is used for all the on-chip logic except that associated with refresh operations such as the krqak_b interface, refresh timer and refresh control which are clocked by signal clk.

Signal clk is the output signal from buffer 66, consisting of NAND gate 68 and inverter 72. Input signals to NAND gate 68 are signal exclk (through buffer 50) and signal inclk. Buffer 50 and therefore buffer 58 are controlled by the enabling signal exclken_b. The ring oscillator 30 and therefore the inclk signal are controlled by the enabling signal incken_b. The enabling signals are generated by the zz control logic 78. Signal exclken_b is activated during normal operation when signal zz is deactivated low. Signal inclken_b is activated during sleep mode.

Since signals inclk and exclk are asynchronous to each other, glitches on the clk signal may occur when entering and leaving sleep mode during which one clock source is turned on and the other is turned off. One way to ensure that a clock glitch does not occur in these circumstances is to turn off one clock signal before turning on the other clock signal. Another consideration is to make sure that the device does not go into the sleep mode when the device is processing a transaction, or the transaction may be corrupted. Since the system timing guarantees that no memory access is generated when the sleep mode is activated, the only possible transaction that can occur when the sleep mode is activated is the refresh operation.

Referring to FIG. 3, during the refresh operation, signal Rfena (refresh enable) is high, and the transparent latch 84

(including inverters 79, 81, 83 and pass gate 85) is in the latched-mode. This ensures that signal zz is not passed through to the output terminal of logic 78. In the pass-through mode, latch 84 inverts the zz signal. Delay of the buffer 88 (inverters 90, 92) is set to be substantially equal to the sum of the delay in buffers 50 and 58 so that signal ezzclk is synchronous with signal clko when signal exclken_b is low. The output terminal of latch 84 is connected to D flip-flop 98. Here, the inverted zz signal is resynchronized with the ezzclk signal, since the clock input terminal of flip-flop 98 is driven by clock buffer 88. The output signal of flip-flop 98, ezz_b, is connected to D flip-flop 102. Here, the ezz_b signal is resynchronized to the inclk signal, and the output signal mzz_b is coupled to another D flip-flop 106. Here, the signal mzz_b is again resynchronized to signal ezzclk.

The resynchronization flip-flops 98, 102, 106 ensure that the clock signals clko and inclk are turned off and on without clock glitches. The clock enable signal exclken_b is controlled by signals ezz_b and zz_b, which are synchronous with the rising-edge of signal ezzclk and thus substantially to the rising-edge of signal exclk. This ensures that signal clko is turned on or off at the rising-edge of signal exclk. Similarly, signal mzz_b ensures (by operation of NAND gate 116) that signal inclk is turned off at the rising clock-edge of signal inclk. When leaving sleep mode, signal ezz_b goes from low to high.

Since signal zz_b lags behind signal mzz_b by one exclk period, NAND gate 110 activates signal exclken_b one exclk period after signal inclken_b is deactivated. Therefore, signal inclk is disabled before buffer 50 is enabled, thus ensuring that a clock glitch does not appear in signal clk when the input clock source switches from signal inclk to signal exclk. When entering sleep mode, signal ezz_b goes from high to low, the long buffer delay on the ring oscillator 30 ensures that buffer 50 is disabled before the first high-to-low transition of signal inclk effect takes place, thus ensuring that a clock glitch does not appear in signal clk. Although this clock control is illustrated in this embodiment for the operation of the device switching between normal and sleep mode, the approach can also be used for other applications which require switching between two clock signals which are asynchronous to each other.

Figure 4:
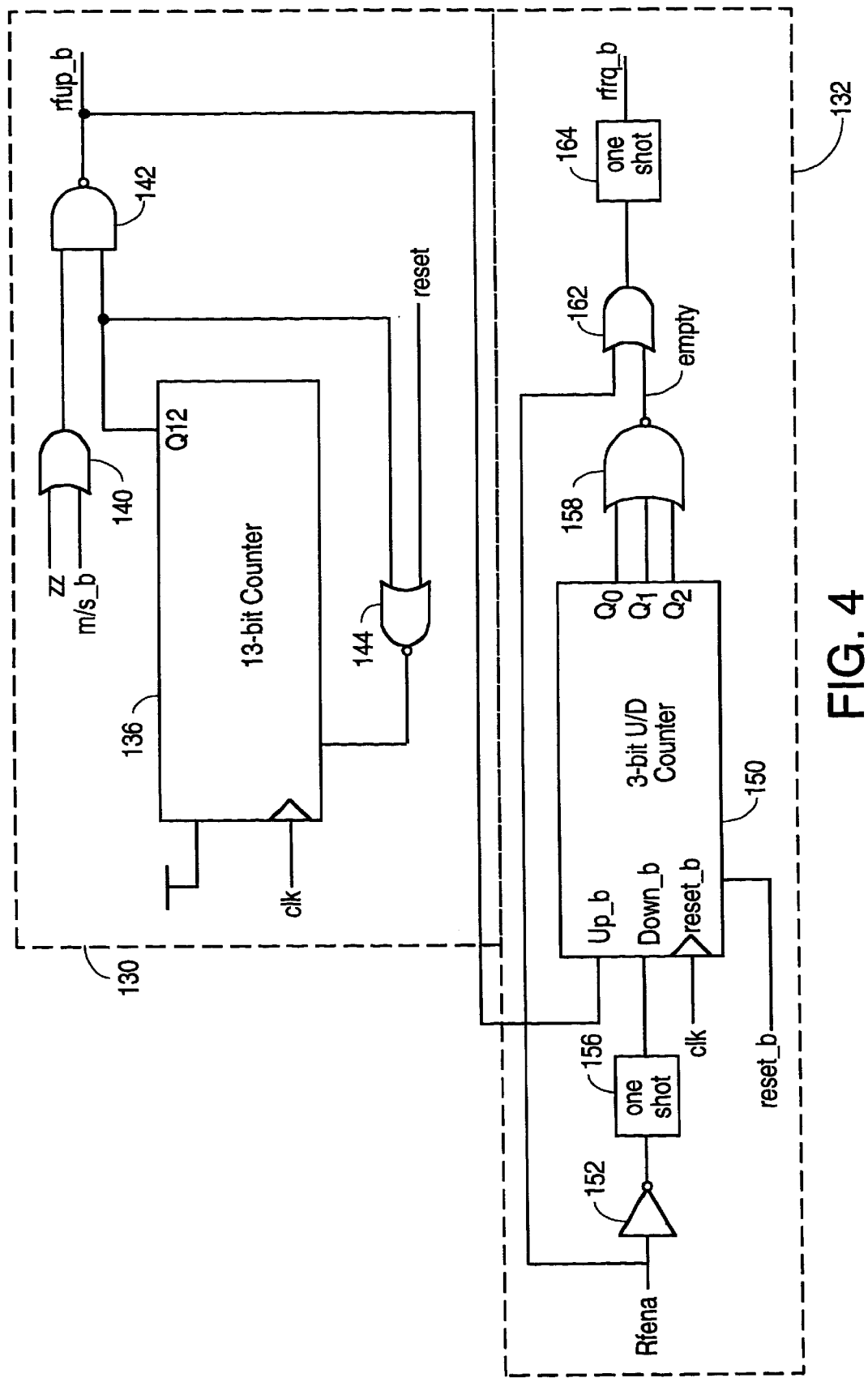
FIG. 4 shows a schematic diagram of a refresh request generator.

FIG. 4 shows a schematic diagram of the present refresh request generator circuit in each memory device, and which has two parts: the refresh timer 130 and the request accumulator 132. The refresh timer 130 includes a 13-bit synchronous binary-counter 136 and logic gates 140, 142, 144. The output signal of the most significant bit Q12 of counter 136 is logically NANDed by gates 140, 142 with the m/s_b signal to form the rfup_b signal. When asserted low, signal rfup_b indicates that the refresh time is up and the memory device needs to go through a refresh cycle. In the slave mode, when signal m/s_b stays low, the rfup_b signal is forced to stay high, effectively disabling the output of the refresh timer. In the sleep mode (when signal zz is high), the effect of signal m/s_b is masked and the circuit operates in the same way as in master mode.

Figure 5:
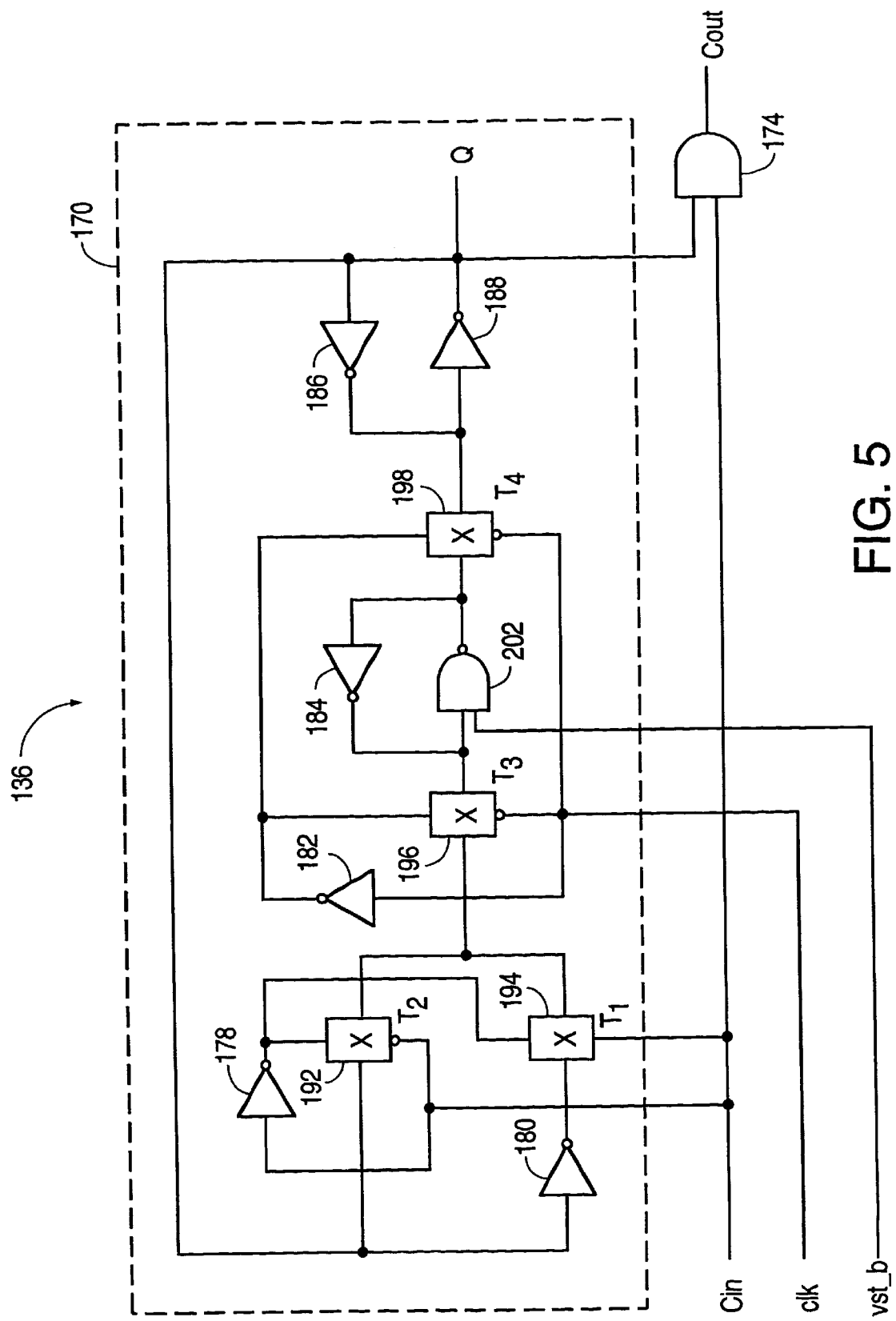
FIG. 5 shows a schematic diagram of a bit slice of the refresh counter of FIG. 4.

FIG. 5 shows a schematic diagram of one bit-slice in the binary counter 136 including a resettable toggle flip-flop 170 and a 2-input AND gate 174. Flip-flop 170 includes inverters 178–180, pass gates 192–198 and NAND gate 202. The carry-in input signal Cin controls the state of the output signal Q at the next rising clock edge. A high signal Cin causes signal Q to toggle and a low causes signal Q to remain unchanged. The carry out signal Cout connects to the Cin terminal of the next bit for controlling the output state of the next most-significant-bit. CinO, the carry in terminal of the most-insignificant bit, is connected to Vcc. The counter 136 (see FIG. 4) is a modulo 4096 counter, with signal Q12 logically NORed by gate 144 with an external reset signal for resetting the counter 136. Since the reset operation takes place only on the master portion of the flip-flop, the rfrq_b signal stays low for one clock period. The counter 136 thus generates a low going pulse every 61.4 $\mu$s when the clock frequency is 66 MHz. With (in one example) a total of 1024 rows and 5 rows burst refresh per each refresh period, the entire memory array is refreshed every 12.6 ms (61.4 $\mu$s×1024/5).

The request accumulator 132 of FIG. 4 accumulates the refresh requests, in case the memory controller cannot generate an acknowledge signal before the next refresh time is up. This may occur when the system is busy accessing the memory devices. The accumulator includes a 3-bit up-down counter 150; up to seven requests can be queued up in counter 150. When counter 150 overflows, its output signal stays at count 7. When this occurs, the memory is under refreshed. The counter 150 increments by one when signal rfup_b is low and decrements by one when signal Rfena is high. Signal Rfena is connected to counter 150 through an inverter 152 and a one-shot 156. The inverter 152 inverts the active high signal to active low and the one-shot 156 converts the active low signal, which lasts for 15 clock cycles, to a pulse which stays low for one clock period. This ensures that counter 150 decrements by one only for each activation of the Rfena signal. The output terminals Q0, Q1, Q2 of counter 150 are connected to a 3-input NOR gate 158. The output signal (empty) of NOR gate 158 is low only when all three signals at terminals Q0, Q1, Q2 are low, that is, no refresh request is pending. The empty signal is connected to a one-shot 164 via a 2-input NOR gate 162.

When the memory is not carrying out any refresh operation, signal Rfena is low. Any new requests cause the signal empty to go from high to low, and the high to low transition causes a active low pulse to appear at the output terminal of request accumulator 132, which is signal rfrq_b. The active low pulse lasts for one clock period. When multiple requests are accumulated and the signal empty stays low, and for each activation of signal Rfena, the input signal to the one-shot 164 goes high, arming the one-shot 164 again. When signal Rfena goes back low, another active low pulse is generated at terminal rfrq_b.

As explained below, signal Rfena is activated when an acknowledge for refresh is received from the memory controller 10. Signal Rfena stays high during the refresh period. Consequently, no request is generated when the memory is busy with refresh. Accumulated requests are sent to the memory controller 10 immediately after the refresh operation is finished. This avoids the requirement to accumulate acknowledges during refresh period, since the memory controller can generate an acknowledge within 3 clock cycles when the memory device sends a request. The accumulator 132 is cleared or reset during system reset, or when the device enters zz mode, during which the input signal reset_b is low.

Figure 6:
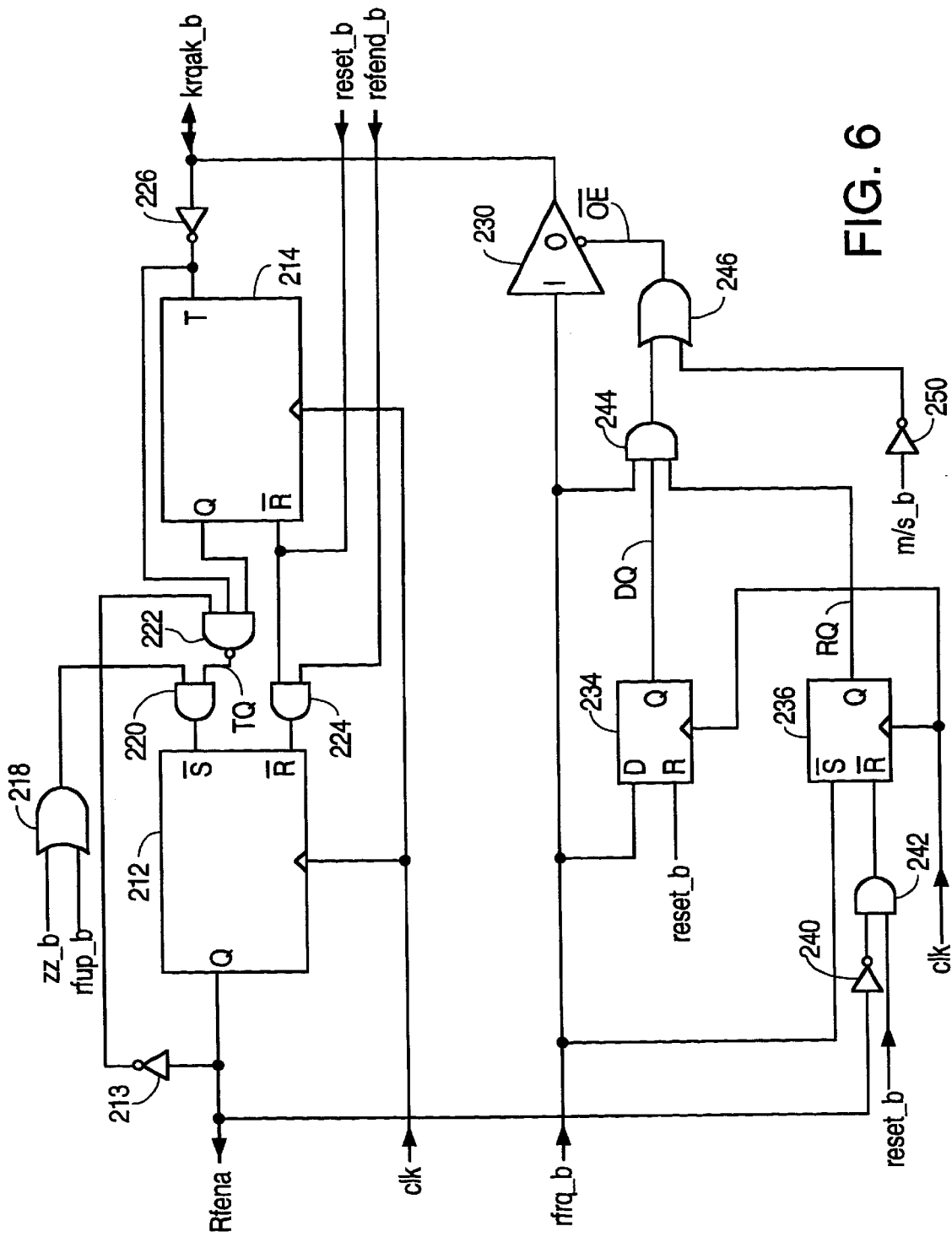
FIG. 6 shows a schematic diagram of a krqak_b interface.

FIG. 6 shows a schematic of the krqak_b interface circuit of the memory device. This circuit generates and monitors the krqak handshake and has an input section and an output section, as shown. This interface includes flip-flop 212 and counter 214, associated logic elements 218–226, and (in the lower part of FIG. 6) tri-state buffer 230, flip-flops 234, 236, and associated logic elements 240–250.

Figure 7:
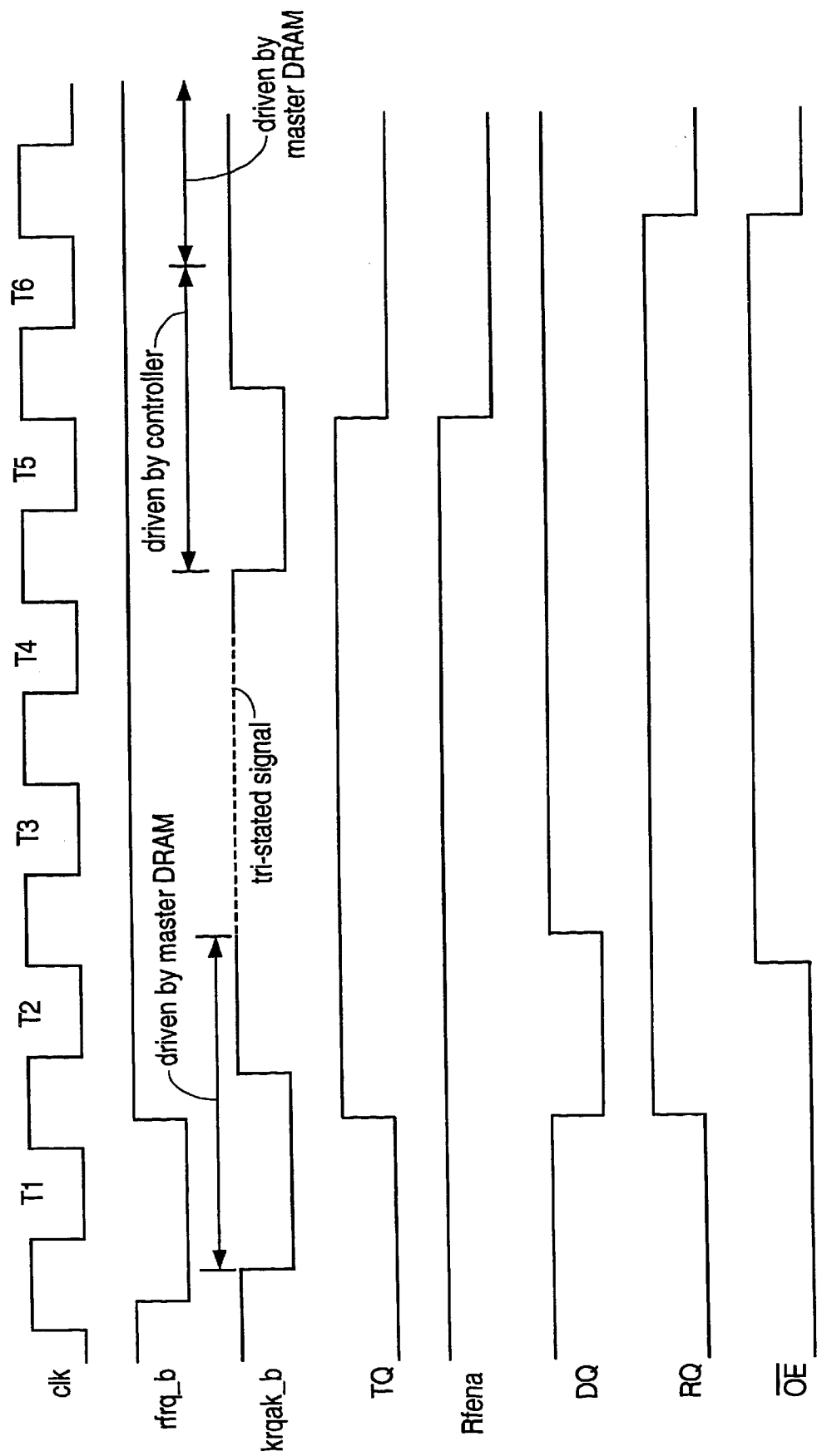
FIG. 7 shows a timing diagram of a krqak_b handshake.

FIG. 7 illustrates the timing of the protocol for operation of the interface of FIG. 6. When the device is not in sleep mode (i.e. signal zz_b is high) and there is no refresh request, signal rfrq_b is high, signal DQ is high and signal RQ is low, signal krqak_b is driven high by the master memory device (signal m/s_b is set to high). In time interval T1, the refresh timer of the master device is timed up and signal rfrq_b is low, the tri-state buffer 230 drives signal krqak_b low. The activation of signal rfrq_b causes signal DQ to go low in interval T2 and the deactivation of signal rfrq_b causes signal DQ to go high in interval T3. The low state of signal DQ keeps the tri-state buffer 230 in the enable state. The signal rfrq_b goes high in interval T2 which causes signal krqak_b to go high. In interval T3, signal DQ goes high, and both signals rfrq_b and RQ stay high, buffer 230 is thus tri-stated. At this time, the high state signal krqak_b is kept high by an external pullup resistor R1 of FIG. 1.

On the input side of the interface of FIG. 6 (when signals reset and rfend_b are normally high) the low state of signal krqak_b at interval T2 is registered by the 1-bit counter 214 with its output signal TQ high. After a certain period of time (in this example 2 clock cycles) the memory controller 10 acknowledges the refresh request by driving signal krqak_b low for one clock cycle at interval T5 and high for one clock cycle at interval T6, then puts krqak_b buffer 230 in a tri-state condition. The low pulse of signal krqak_b in interval T5 sets the output signal of the RS-flip-flop 212, signal Rfena, high. The high state of the signal Refena starts the internal refresh. During sleep mode, signal krqak_b is high and signal zz_b is low, flip-flop 212 is set when the refresh time is up, that is signal rfup_b is low. This initiates the refresh operation without going through the krqak_b handshake.

Figure 8:
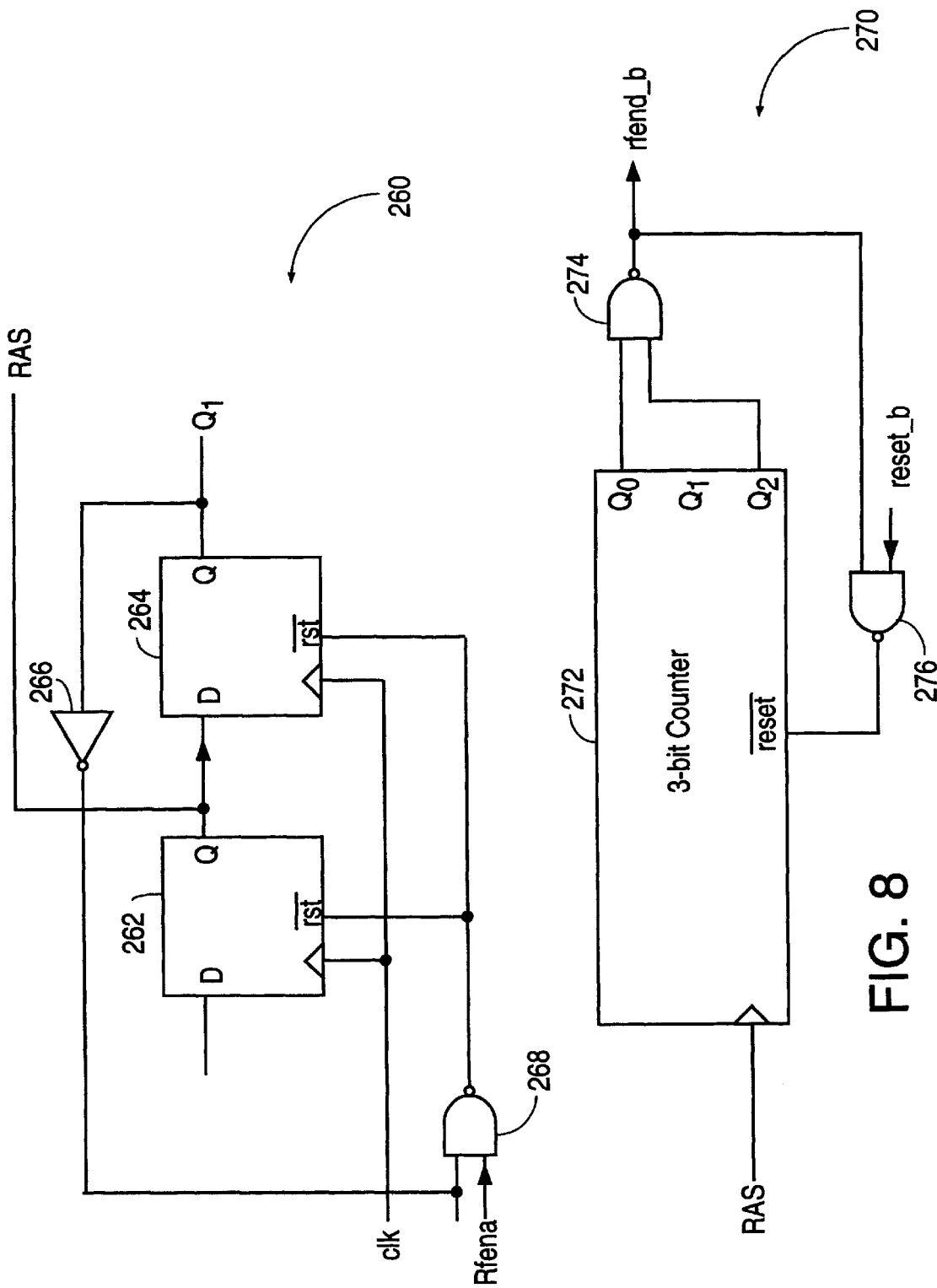
FIG. 8 shows a schematic diagram of a refresh control sequencer.

FIG. 8 shows a schematic of the refresh control sequencer circuit, present in each memory device, which has two parts: the memory control sequencer 260 and the RAS cycle timer 270. The memory sequencer 260 generates the conventional memory control signal RAS. When signal RAS is activated, a row of memory cells in the row selected by the row address from the refresh address counter (not shown) is activated and refreshed. The memory sequencer 260 includes a two-bit counter (flip-flops 262, 264 and gates 266, 268) configured as a modulo 3 counter. Its output signals RAS and Q1 count through the values of 00, 10 and 11 respectively. The sequencer 260 is enabled when the input signal Rfena is high.

The RAS cycle counter 270 keeps track of the number of RAS cycles that the memory device has gone through during the refresh period. The counter 270 includes a 3-bit binary counter 272 configured as a modulo 5 counter by gate 274. The clock input of the counter is driven directly by the RAS signal. The reset_b input signal is provided for resetting counter 272 via gate 276 during system reset. The output signal rfend_b (refresh end) is activated when the memory goes through five RAS cycles indicating end of refresh period. The refend_b signal is used to reset the flip-flop 212 in the input logic of the krqak_b interface (FIG. 6). This in turn deactivates the rfena signal. The rfend_b signal is also used to reset the counter 272. Note that the reset is done synchronously. That is, only the master portion of each of the flip-flops (in the registers in the counter 272) is immediately affected by the reset operation.

This disclosure is illustrative and not limiting; further modifications will be apparent to one skilled in the art in light of this disclosure and are intended to fall within the scope of the appended claims.

I claim:

1. A random access memory device comprising:
    an array of memory cells arranged in addressable rows and columns;
    a refresh circuit coupled to the array of memory cells for refreshing the memory cells; and
    a refresh terminal coupled to the refresh circuit that when connected externally of the device triggers the device to enter a refresh period, wherein during the refresh period a burst of memory refresh cycles are performed to refresh in sequence a plurality of rows of the memory cells.

2. The device of claim 1, further comprising a terminal coupled to the refresh circuit that when connected externally of the device indicates operation of the device in one of a master or slave mode.

3. The device of claim 1, further comprising a self refresh mode terminal coupled to the refresh circuit that when connected externally of the device puts the device in a self refresh mode.

4. The device of claim 1, wherein the refresh terminal when coupled externally of the device receives an acknowledge signal to trigger the device to enter the refresh period.

5. The device of claim 4, wherein the acknowledge signal is low for two clock cycles to trigger the device to enter the refresh period.

6. The device of claim 2, wherein in the master mode of operation, the device conducts a handshake sequence with an associated memory controller on a refresh signal line monitored by other associated memory devices to cause the master and/or the other memory devices to enter a refresh period, wherein the handshake sequence includes:
    (a) a refresh signal is generated by the master device by driving the refresh signal low for one clock cycle when an internal refresh timer of the master device times up;
    (b) the master device then drives the refresh signal high for one clock cycle, then the refresh signal line is tristated;
    (c) the controller, upon detecting a refresh request, waits for a certain period of time, then drives the refresh signal low for one clock cycle to indicate an acknowledge;
    (d) the controller then drives the refresh signal high for one clock cycle, then the refresh signal line is tristated; and
    (e) upon detection of the acknowledge, each of the memory devices initiates its refresh period.

7. The device of claim 6, wherein the device includes a circuit coupled to the refresh circuit, which suppresses generation of a refresh request signal when a refresh request is pending.

8. The device of claim 7, further including a circuit coupled to the refresh circuit, for accumulating the refresh requests.

9. The device of claim 3, further comprising self refresh mode control logic coupled to the self refresh mode terminal and including a ring oscillator for generating an internal clock signal when the device is in the self refresh mode.

10. The device of claim 3, wherein the device is clocked by an externally provided clock signal except in the self refresh mode when it is clocked by an internally generated clock signal, the externally provided clock signal differing in phase and frequency from the internally generated clock signal.

11. The device of claim 9, wherein the self refresh mode control logic switches a logic clock signal of the device from an externally provided clock signal to the internal clock signal when entering the self refresh mode, and switches the logic clock signal from the internal clock signal to the externally provided clock signal when leaving the self refresh mode.

12. The device of claim 9, wherein the self refresh mode control logic includes a plurality of series-connected flip-flops coupled to the ring oscillator, thereby eliminating clock glitches when switching between the internal clock signal and an externally provided clock signal.

13. The device of claim 3, wherein the refresh circuitry includes:
a refresh timer; and
a refresh request accumulator coupled to an output terminal of the refresh timer.

14. The device of claim 13, wherein the refresh request accumulator counts refresh requests.

15. The device of claim 3, further comprising a circuit coupled to the refresh circuit for suppressing the device from leaving the self refresh mode during a refresh period.

16. The device of claim 3, further comprising a circuit coupled to the refresh circuit, for suppressing the device from entering the self refresh mode during a refresh period.

17. The device of claim 3, wherein a control signal is transmitted to the self refresh mode terminal to cause the device to enter and leave the self refresh mode.

18. The device of claim 13, wherein the refresh request accumulator is cleared before the device enters the self refresh mode.

19. A random access memory device comprising:
an array of memory cells arranged in addressable rows and columns;
a refresh circuit coupled to the array of memory cells for refreshing the memory cells; and
a master/slave terminal coupled to the refresh circuit that when connected externally of the device indicates operation of the device in one of a master or slave mode;
wherein in a first slave mode, the self refresh circuitry refreshes the array in response to an externally provided refresh signal, the refresh signal being driven by one of another memory device operating in the master mode and an external memory controller;
in a second slave mode, the refresh circuitry refreshes the array in response to a refresh signal from an external memory controller; and
in a third mode, the refresh circuitry refreshes the array in response to an internally generated signal, the refreshing in the third mode being asynchronous to refreshing of any associated memory devices.

20. The device of claim 19, wherein the device, when the master/slave terminal is connected externally to indicate operation in the master mode, generates a handshake sequence with an external memory controller on a request/acknowledge line, and when the handshake sequence is completed, associated memory devices initiate a refresh operation.

21. The device of claim 19, wherein the device includes at least one terminal for receiving a signal for selecting one of the three modes.

22. The device of claim 19, further comprising a self refresh terminal connected to the refresh circuit that when connected externally of the device puts the refresh circuit in a self refresh mode.

23. The device of claim 22, wherein a handshake is maintained via the self refresh terminal between the device and an external signal source to put the device into and out of the self refresh mode.

24. The device of claim 19, wherein the externally provided refresh signal in the first mode includes:

(a) the refresh signal is low for one clock cycle when an internal refresh timer of an associated master memory device times up;
(b) then the refresh signal is high for one clock cycle;
(c) upon detecting of a refresh request from the master memory device, the memory controller drives the refresh signal low for one clock cycle to indicate an acknowledge;
(d) then the memory controller drives the refresh signal high for one clock cycle; and
(e) upon detection of the acknowledge, the device initiates its refresh operation.

25. A random access memory device comprising:
an array of memory cells arranged in addressable rows and columns;
a refresh circuit coupled to the array of memory cells for refreshing the memory cells; and
a self refresh mode terminal coupled to the refresh circuit that when connected externally of the device puts the refresh circuit in a self refresh mode.

26. The device of claim 25, wherein a control sequence is maintained via the self refresh mode terminal between the refresh circuit and an external signal source to cause the device to enter and leave the self refresh mode.

27. The device of claim 25, wherein the control sequence upon entering the self refresh mode activates the self refresh signal and turns off an external clock signal after the self refresh signal is activated for a certain period of time, and the control sequence upon leaving the self refresh mode turns on the external clock signal for a certain period of time before deactivating the self refresh signal.

28. The device of claim 25, further comprising self refresh mode control logic coupled to the self refresh mode terminal and including a ring oscillator for generating an internal clock signal when the device is in the self refresh mode.

29. The device of claim 28, wherein the self refresh mode control logic includes a circuit that switches a logic clock signal of the device from an external clock signal source to the internal clock signal when entering the self refresh mode, and from the internal clock signal to the external clock signal source when leaving the self refresh mode.

30. The device of claim 29, wherein the self refresh mode control logic includes a plurality of series-connected flip-flops coupled to the ring oscillator, thereby suppressing clock glitches when the logic clock signal of the device switches between the internal clock signal and the external clock signal source when entering or leaving the self refresh mode.

31. A random access memory device comprising:
an array of memory cells arranged in addressable rows and columns;
a refresh circuit coupled to the array of memory cells for refreshing the memory cells; and
a master/slave terminal coupled to the refresh circuit that when connected externally of the device indicates operation of the device in one of a master or slave mode.

32. A method of refreshing a memory device having an array of addressable rows and columns of memory cells, comprising the steps of:
coupling a signal from an external source to the device;
triggering the device into a refresh period upon receipt of the signal from the external source; and
during the refresh period, performing a burst of memory cycles to refresh in sequence multiple rows of the memory cells.

* * * * *